United States Patent

Azam et al.

[11] 4,121,173
[45] Oct. 17, 1978

[54] ARRANGEMENT FOR AUTOMATICALLY CONTROLLING THE FREQUENCY OF A HYPERFREQUENCY GENERATOR FEEDING A RESONANT ELEMENT SUBJECTED TO FLUCTUATIONS IN TEMPERATURE

[75] Inventors: Guy Azam; André Bensussan; Claude Levaillant, all of Buc, France

[73] Assignee: CGR-MeV, Buc, France

[21] Appl. No.: 768,370

[22] Filed: Feb. 14, 1977

[30] Foreign Application Priority Data

Feb. 17, 1976 [FR] France .................. 76 04347

[51] Int. Cl.² .................. H03B 3/04
[52] U.S. Cl. .................. 331/9; 331/1 R; 328/233
[58] Field of Search .................. 331/1 R, 9, 16, 6; 328/233

[56] References Cited

U.S. PATENT DOCUMENTS

| | | | |
|---|---|---|---|
| 2,596,227 | 5/1952 | Fernser | 331/9 |
| 2,726,333 | 12/1955 | Pritchard | 331/9 |
| 3,568,084 | 3/1971 | Bodmer | 331/9 |

Primary Examiner—John Kominski
Attorney, Agent, or Firm—Oblon, Fisher, Spivak, McClelland & Maier

[57] ABSTRACT

An arrangement enables the frequency variation of a resonant element (an accelerating section for example) to be followed in dependence upon its temperature and the frequency of the hyperfrequency generator G feeding this resonant element Q to be controlled in dependence upon the frequency variations thereof. The arrangement comprises at least one reference cavity C associated with means for allowing the circulation of cooling fluid along the walls of said reference cavity and with heat supply for bringing it, at any instant, to the temperature of the resonant element Q, means for measuring the amplitude variation $\Delta a$ of the signal corresponding to the frequency variation of said reference cavity C in terms of its temperature variation and a frequency variation system controlled by a signal proportional to the amplitude variation $\Delta a$, for modifying the operating frequency of the generator G. This arrangement makes it possible to improve the performance of medical accelerators of which the thermal time constant is considerable in relation to their short operating time.

5 Claims, 6 Drawing Figures

ARRANGEMENT FOR AUTOMATICALLY CONTROLLING THE FREQUENCY OF A HYPERFREQUENCY GENERATOR FEEDING A RESONANT ELEMENT SUBJECTED TO FLUCTUATIONS IN TEMPERATURE

This invention relates to an arrangement for automatically controlling the frequency of a hyperfrequency generator intended to feed a resonant element operating in transient mode (accelerating sections of a particle accelerator for example).

It is known that the performance of a particle accelerator is higher, the more the frequency of the hyperfrequency signal injected into the accelerating sections corresponds to the operating frequency of the accelerator. Now, this operating frequency varies appreciably when the temperature of the accelerating sections increases under the effect of the power dissipated into the accelerating sections when the accelerator is in operation. It is therefore necessary to know at any moment the frequency of the accelerating sections and, more particularly, the operating frequency of the accelerating section into which the signal is injected so as to be able to adjust the operating frequency of the generator to that frequency. These accelerating sections are generally cooled by a cooling fluid (water for example) of which the temperature follows the temperature of the sections which it cools. It is possible to determine the frequency variation of the accelerating sections during operation without having to extract an HF signal therefrom by using a reference cavity tuned to a frequency close to the frequency of the no-loaded accelerating sections and by keeping the temperature of the reference cavity substantially equal to that of the accelerating sections by suitable means, one of these means being to circulate the cooling fluid of the accelerating sections around the reference cavity.

In fact, the frequency of the reference cavity follows the variations in the temperature of the cooling water of the accelerating sections and not the temperature of their constituent material which does not give rise to any disadvantages when the accelerator is operating in permanent mode because it is possible to allow for the temperature difference by regulating the frequency of the reference cavity with a corresponding frequency shift. However, when the operating time of the accelerator is below the thermal time constant of the accelerating sections, as is the case in medical accelerators for example, the above-mentioned regulation is no longer possible, the equilibrium temperature during this short period of operation not being reached. By virtue of the arrangement according to the invention, it is possible to follow the variation in the frequency of the accelerating sections or, more generally of a resonant element of which the frequency varies with the temperature of its walls and to control the frequency of the hyperfrequency generator supplying this resonant element with HF energy in such a way that the frequency of the signal injected into this resonant element is as close as possible to the tuning frequency of the resonant element at any given moment.

According to the invention, an arrangement for automatically controlling the frequency of a hyperfrequency generator feeding a resonant element of which the frequency varies with the temperature of its walls, said resonant element being cooled by means of a cooling fluid, said arrangement comprising at least one reference resonant cavity tuned to a frequency $f = f_o - \Delta f$, $f_o$ being equal to the non-operating frequency of the resonant element, said reference cavity being associated with means allowing the circulation of said cooling fluid along the walls of said reference cavity, said reference cavity being associated with a heat supply for bringing it, at any given time $t$, to a temperature substantially equal to that of said resonant element, means being provided for measuring the amplitude variation $\Delta a = a - a_s$ of the signal corresponding to the frequency variation of said reference cavity in terms of its temperature variation, $a$ being the amplitude of the resonant cavity signal at a given instant and $a_o$ being the initial signal amplitude and means for controlling the frequency of said hyperfrequency generator in dependence upon the amplitude variation of said signal.

The invention will be better understood and other features thereof will become apparent from the following description in conjunction with the accompanying drawings, wherein.

Figure 1:
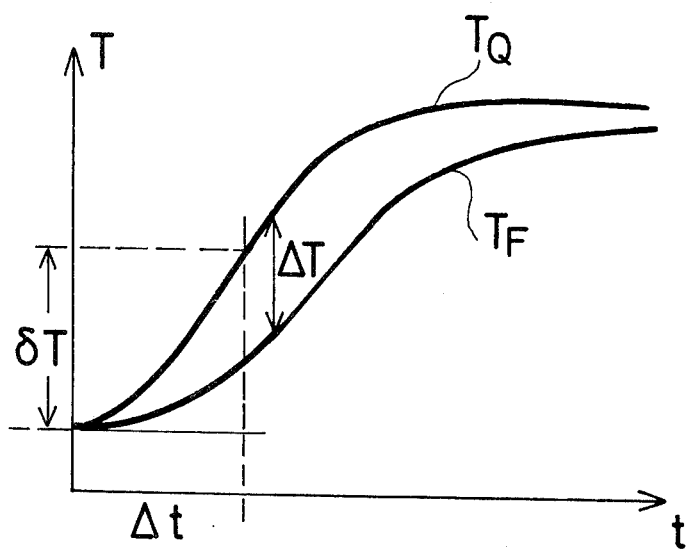
FIG. 1 is the curve respectively showing the variation in the temperature of an accelerating section during operation and the corresponding temperature variation of the fluid which cools this section.
Figure 2:
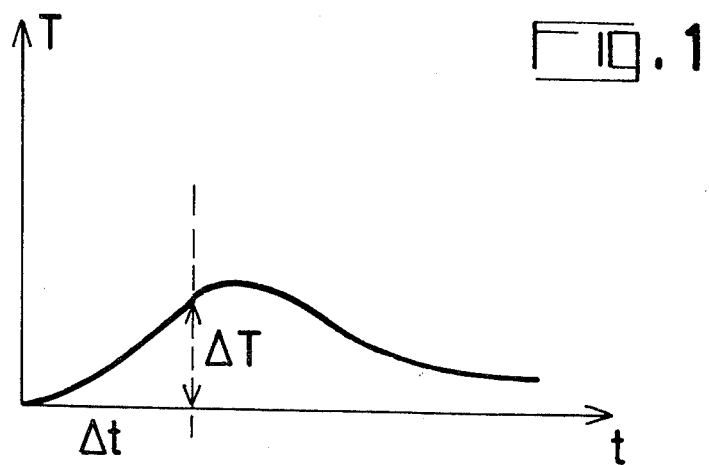
FIG. 2 is a curve showing an example of variation of the heat supply which can be applied to the reference cavity by a heating element.

Irradiation apparatus of the type which use particle accelerators often have an operating time below the thermal time constant of the accelerating section of which the electrical characteristics vary in dependence upon temperature. FIG. 1 shows the variation $T_Q$ in the temperature of the walls of the accelerating structure during the period $\Delta t$ for which it is operative; in medical applications, this period $\Delta t$ may be equal for example to one third of the value of the thermal time constant of the accelerating structure. The curve $T_F$ of FIG. 1 represents the variation in the temperature of the cooling fluid of the accelerating section. These curves $T_Q$ and $T_F$ reveal a temperature difference $\Delta T = T_Q - T_F$ which represents the temperature difference existing at any given moment between the accelerating section and the reference cavity. This difference which varies during the period $\Delta t$, may be compensated by an external heat supply of which the value varies as shown by the curve of FIG. 2.

Figure 3:
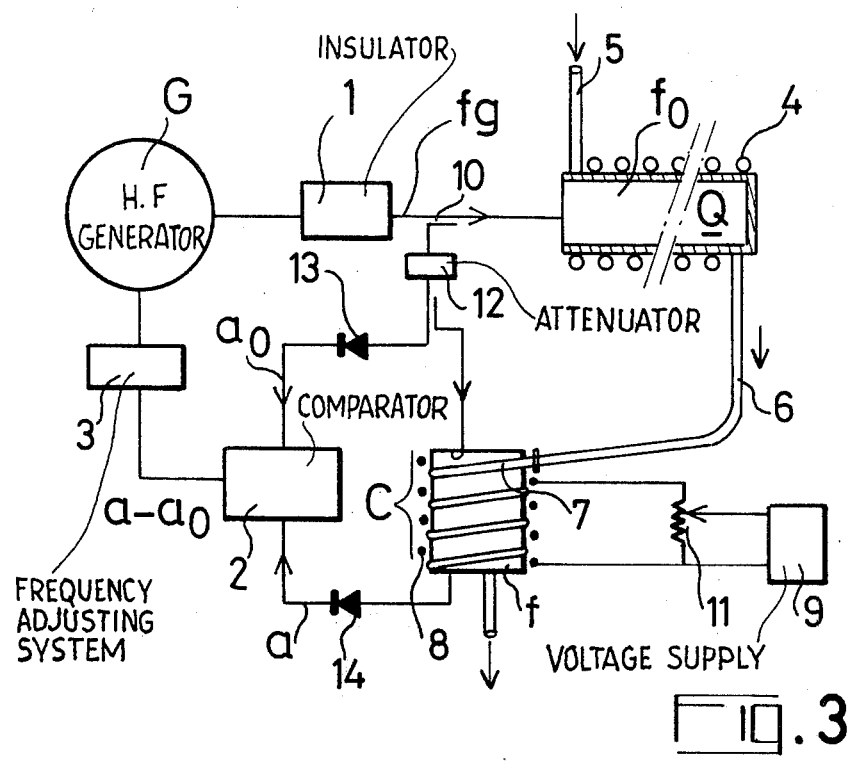
FIG. 3 shows an example of embodiment of a frequency control arrangement according to the invention.

In order to improve the performance of the accelerating structures of which the frequency varies with the temperature of their walls, it is of advantage to control the frequency of the hyperfrequency generator feeding these accelerating sections in dependence upon their temperature by means of the frequency control arrangement according to the invention of which one example of embodiment is illustrated in FIG. 3.

This arrangement for controlling the frequency of a hyperfrequency generator G comprises an insulator 1, a coupling system 10 for extracting part of the hyperfrequency signal supplied by the generator G, a resonant element of which the electrical characteristics vary with the temperature of its walls, this resonant element in the present case being an accelerating section Q of a linear charged particle accelerator, a reference cavity C, a signal amplitude comparator 2, the signals being detected by detectors 13 and 14, a variation system 3 for varying the frequency of the generator G.

The accelerating section Q, of which the non-operating tuning frequency is equal to $f_o$, is cooled by a fluid (water for example) introduced into the cooling circuit 4 through an inlet pipe 5 and removed by means of an outlet pipe 6 which is connected to a fluid circulation system 7 associated with the reference cavity C.

Figure 4:
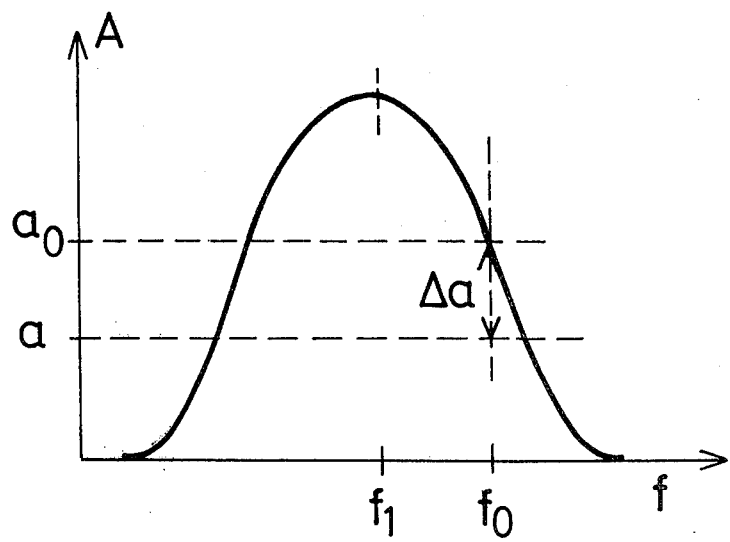
FIG. 4 shows the response curve of the reference cavity used in the arrangement illustrated in FIG. 3.

The reference cavity C is tuned to a frequency $f = f_o - \Delta f$, the value $\Delta f$ being selected in such a manner that, at the frequency $f_o$, the amplitude of the response signal of the cavity C is substantially equal for example to half the amplitude of the corresponding signal at the frequency $f$ (FIG. 4).

A heating resistance 8, which is associated with the reference cavity C, is connected to a voltage supply 9 through a potentiometer 11. The heat supply (heating resistance 8) allows to increase the cavity C temperature by $\Delta T$ degrees, this temperature variation $\Delta T$ being predetermined as a function of time (non-linear variation, for example), as shown in FIG. 2. In this case, the characteristics of the potentiometer 11 may be predetermined.

In operation, the temperature of the reference cavity C is kept substantially equal at any moment to the temperature of the accelerating section Q by virtue of the cooling fluid of this accelerating section circulating around the wall of the reference cavity C in conjunction with the heating resistance 8. To an increase $\delta T$ in the temperature of the accelerating section Q and hence of the reference cavity C there corresponds a variation $\delta T$ in the temperature of the accelerating section Q and hence of the reference cavity C there corresponds a variation $\delta f$ in their tuning frequency which is reflected in a variation $\Delta a$ in the amplitude $a$ of the response signal of this cavity C, this variation $\Delta a$ being measured by comparing the amplitude $a$ of the response signal with a signal of constant amplitude $a_o$ extracted by means of the coupling system 10 from the hyperfrequency signal supplied by the generator G, an attenuator-compensator 12 enabling this signal of amplitude $a_o$ to be obtained. The amplitude variation $\Delta a = a - a_o$ controls the operation of the frequency variation system 3, causing the frequency of the generator G to vary by a quantity $\Delta f$ corresponding to the frequency variation of the accelerating section Q.

Figure 6:
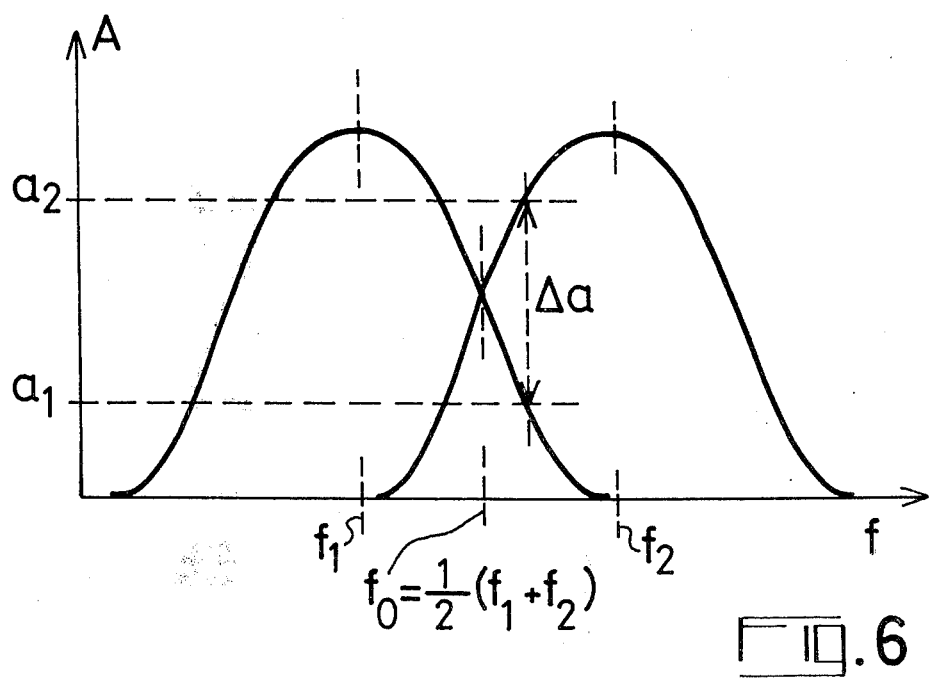
FIG. 6 shows the response curves of the reference cavities used in the arrangement illustrated in FIG. 5.
Figure 5:
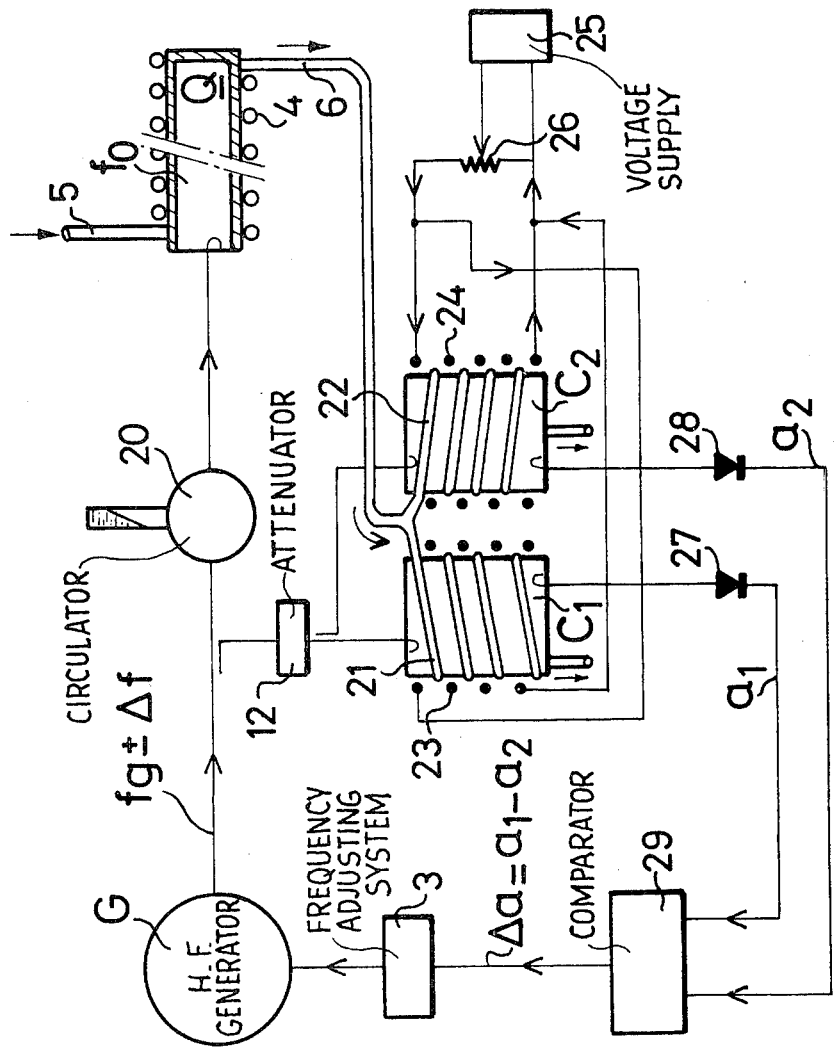
FIG. 5 shows another example of embodiment of a control arrangement according to the invention.

In a second example of embodiment (FIG. 5), the frequency control arrangement according to the invention comprises two reference cavities $C_1$ and $C_2$ respectively tuned to the frequencies $f_1 = f_o - \Delta f$ and $f_2 = f_o + \Delta f$, the value $\Delta f$ being selected in such a way that, at the frequency $f_o$, the amplitudes $a_1$ and $a_2$ of the response signals of the cavities $C_1$ and $C_2$ are substantially equal for example to half the amplitude of the corresponding signals at the frequencies $f_1$ and $f_2$, as shown in FIG. 6. A hyperfrequency signal of constant level is injected into these cavities $C_1$ and $C_2$, this signal being extracted from the signal emitted by the generator G. The "non-operating" frequency $f_o$ of the accelerating section Q is thus equal to $\frac{1}{2}(f_1 + f_2)$. At the frequency $f_o$, the cavities $C_1$ and $C_2$ respectively supply response signals of amplitudes $a_{o1}$ and $a_{o2}$ which are equal. Suitable decoupling of the generator G and its load (accelerating structure) is obtained for example by means of a hyperfrequency circulator 20. Two fluid circulation systems 21 and 22 are respectively associated with the reference cavities $C_1$ and $C_2$ which are connected in parallel to the pipe 6 for removal of the cooling fluid of the accelerating section Q. Also associated with the reference cavities $C_1$ and $C_2$ are heating resistances 23 and 24 connected for example in parallel to a feed circuit comprising a voltage supply 25 and a potentiometer 26. The supply of heat applied by these two resistances 23 and 24 to the cavities $C_1$ and $C_2$ has the same predetermined value which may vary as a function of time so that the variation in the temperature of these cavities $C_1$ and $C_2$ is identical at any moment with the temperature variation of the accelerating section Q. Two hyperfrequency detectors 27 and 28, associated with the reference cavities $C_1$ and $C_2$, supply two signals of amplitude $a_1$ and $a_2$ and a comparator 29 enables these amplitudes $a_1$ and $a_2$ to be compared at any instant.

In operation, a variation $\delta T$ in the temperature of the accelerating section Q produces a variation $\delta f$ in the frequency of the accelerating section Q and hence of the cavities $C_1$ and $C_2$, resulting in a variation in the amplitudes $a_1$ and $a_2$. The comparator 29 supplies a signal proportional to the difference $\Delta a = a_1 - a_2$, this latter signal controlling the operation of the frequency variation system 3 for adjusting the frequency of the generator G to the frequency of the accelerating section Q and thus bringing the difference $\Delta a$ substantially to zero.

These two examples of embodiment of a control arrangement according to the invention make it possible to control the operating frequency of the generator G feeding a resonant element of which the tuning frequency varies with its temperature, without having to extract part of the signal of the resonant element and without having to use a thermocouple for measuring the temperature variations of this resonant element.

A control arrangement such as this also enables the possible frequency drifts of the hyperfrequency generator G to be corrected.

In addition, when the generator G is a klystron triggered by a low power pilot, the reference cavity (or cavities) may be introduced into the feedback loop and the error signal $\Delta a = a - a_o$ (or $\Delta a = a_1 - a_2$) may then be used for adjusting the frequency thereof and hence of the klystron with which it is associated.

What I claim is:

1. An arrangement for automatically controlling the frequency of a hyperfrequency generator feeding a resonant element of which the frequency varies with the temperature of its walls, said resonant element being cooled by means of a cooling fluid, said arrangement comprising at least one reference resonant cavity tuned to a frequency $f = f_o - \Delta f$, $f_0$ being the non-operating frequency of the resonant element, said reference cavity being associated with means allowing the circulation of said cooling fluid along the walls of said reference cavity, said reference cavity being associated with a heat supply, for bringing it at any given moment $t$, to a temperature substantially equal to that of said resonant element, means being provided for measuring the amplitude variation $\Delta a = a - a_o$ of the signal corresponding to the frequency variation of said reference cavity in terms of the temperature variation of said resonant element, $a$ being the amplitude of the resonant cavity signal at a given instant and $a_0$ being the initial signal amplitude, and means for controlling the frequency of said hyperfrequency generator in dependence upon the amplitude variation of said signal.

2. A control arrangement as claimed in claim 1, wherein said heat supply comprises a heating resistor located around said refernce cavity, and related to a voltage supply by means of a potentiometer having adjustable characteristics.

3. A control arrangement as claimed in claim 1, comprising coupling means for extracting part of the signal emitted by the hyperfrequency generator, a variable attenuator which supplies from this partial signal a signal of constant amplitude $a_o$, a comparator for measuring the amplitude difference $\Delta a = a - a_o$ and supplying a signal proportional to $\Delta a$, said signal proportional to $\Delta a$ controlling the operation of a frequency variation system modifying the frequency of said hyperfrequency generator so as to obtain $\Delta = 0$.

4. A control arrangement as claimed in claim 1, comprising two reference cavities respectively tuned to the frequencies $f_1 = f_o + \Delta f$ and $f_2 = f_0 - \Delta f$, said reference cavities being respectively raised to the temperature of said resonant element by means of said resonant element cooling fluid which may circulate along the walls of said reference cavities and by means of two heating elements respectively associated with the two reference cavities, said two heating elements having equal values and being connected to a voltage supply by means a potentiometer having adjustable caracteristics, and means for measuring the difference $\Delta a = a_1 - a_2$, $a_1$ and $a_2$ being the respective amplitudes of the response signals of said reference cavities, said amplitudes $a_1$, $a_2$ varying in dependence upon the tuning frequency of said resonant element and said tuning frequency varying with the temperature of said resonant element.

5. A control arrangement as claimed in claim 4, wherein said means for measuring the difference $\Delta a$ comprise a comparator supplying a signal proportional to $\Delta a$, said signal proportional to $\Delta a$ controlling a frequency variation system modifying the frequency of said hyperfrequency generator so as to obtain $\Delta a = 0$.

* * * * *